(12) United States Patent
Oba et al.

(10) Patent No.: US 10,147,656 B2
(45) Date of Patent: Dec. 4, 2018

(54) SIZING DEVICE, POLISHING APPARATUS, AND POLISHING METHOD

(71) Applicant: SHIN-ETSU HANDOTAI CO., LTD., Tokyo (JP)

(72) Inventors: Shigeru Oba, Nishigo-mura (JP); Shiro Amagai, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/576,120

(22) PCT Filed: Mar. 17, 2016

(86) PCT No.: PCT/JP2016/001528
§ 371 (c)(1),
(2) Date: Nov. 21, 2017

(87) PCT Pub. No.: WO2016/208101
PCT Pub. Date: Dec. 29, 2016

(65) Prior Publication Data
US 2018/0138097 A1  May 17, 2018

(30) Foreign Application Priority Data
Jun. 22, 2015 (JP) ................. 2015-124892

(51) Int. Cl.
*H01L 21/66* (2006.01)
*B24B 37/013* (2012.01)
(Continued)

(52) U.S. Cl.
CPC ............ *H01L 22/26* (2013.01); *B24B 37/013* (2013.01); *B24B 37/07* (2013.01); *B24B 37/08* (2013.01);
(Continued)

(58) Field of Classification Search
CPC . H01L 22/26; H01L 21/30625; B24B 37/013; B24B 49/12
See application file for complete search history.

(56) References Cited

U.S. PATENT DOCUMENTS 7,074,109 B1 * 7/2006 Bennett ................. B24B 37/013
257/E21.304
2006/0199473 A1 * 9/2006 Suzuki ................... B24B 37/24
451/8

(Continued)

FOREIGN PATENT DOCUMENTS

| JP | H11-285956 A | 10/1999 |
| JP | 2010-34462 A | 2/2010 |
| JP | 2014-223704 A | 12/2014 |

OTHER PUBLICATIONS

May 31, 2016 International Search Report issued in International Patent Application No. PCT/JP2016/001528.

*Primary Examiner* — Charles Garber
*Assistant Examiner* — S. M. S Imtiaz
(74) *Attorney, Agent, or Firm* — Oliff PLC

(57) ABSTRACT

A sizing device in a polishing apparatus for measuring a thickness of a wafer in course of polishing by laser beam interference, includes: a light-source for irradiating the wafer in course of polishing with a laser beam, a light-receiving portion for receiving reflected light from the wafer in course of polishing irradiated with the laser beam from the light-source, a calculating part for calculating a measured value of the thickness of the wafer in course of polishing irradiated with the laser beam based on the reflected light received through the light-receiving portion. The calculating part can calculate the wafer thickness in course of polishing by calculating a measuring error value of the wafer thickness in course of polishing from resistivity of the wafer in course of polishing based on a previously determined correlation (Continued)

between wafer resistivity and measuring error value of wafer thickness, and by compensating the measuring error value.

20 Claims, 3 Drawing Sheets

(51) Int. Cl.
| | | |
|---|---|---|
| *B24B 37/07* | (2012.01) | |
| *B24B 49/12* | (2006.01) | |
| *H01L 21/306* | (2006.01) | |
| *B24B 37/08* | (2012.01) | |
| *B24B 37/20* | (2012.01) | |
| *H01L 21/02* | (2006.01) | |

(52) U.S. Cl.
CPC ............ *B24B 37/205* (2013.01); *B24B 49/12* (2013.01); *H01L 21/30625* (2013.01); *H01L 21/02024* (2013.01)

(56) References Cited

U.S. PATENT DOCUMENTS

| | | | | |
|---|---|---|---|---|
| 2008/0138721 | A1* | 6/2008 | Hiramoto | B82Y 10/00 430/5 |
| 2009/0263918 | A1* | 10/2009 | Lahiri | B24B 37/013 438/3 |
| 2011/0130073 | A1* | 6/2011 | Furukawa | B24B 37/042 451/6 |
| 2013/0032573 | A1* | 2/2013 | Ogata | B24B 37/08 216/53 |

* cited by examiner

SIZING DEVICE, POLISHING APPARATUS, AND POLISHING METHOD

TECHNICAL FIELD

The present invention relates to a sizing device, a polishing apparatus, and a polishing method.

BACKGROUND ART

With the progress of miniaturization and layer-increasing of semiconductor devises, polishing technologies such as Double Sided Polishing (DSP) have been an essential technology for production process of semiconductor devises.

In DSP for flattening, one of the important specification is in-plane uniformity (flatness) of finished thickness of a substrate. To improve the in-plane uniformity of finished thickness, it is important to control the finished thickness accurately. Accordingly, polishing apparatuses with a sizing device have been used for accurately monitoring the thickness of wafer in course of polishing (e.g., see Patent Document 1).

With increasing requirement for the in-plane uniformity (flatness) of a substrate in finished thickness, the sizing comes to be required to have accuracy of about ±0.1 μm or less, or even higher accuracy in recent years.

The devices that have been used for controlling the finished thickness include an eddy current sizing device, a sizing device to measure the distance to the upper face of carrier, and a sizing device using laser beam interference.

By the sizing apparatus to measure the distance to the upper face of carrier, however, the required sizing accuracy of about ±0.1 μm cannot be secured. When the eddy current sizing device is compared with the laser interferometric sizing device, the latter laser interferometric sizing device is superior in view of limitation of setting environment and measuring accuracy.

Accordingly, the laser interferometric sizing device has come to be widespread. The laser interferometric sizing device has become an essential technology particularly for highly accurate processing of a $P^-$ or $P^+$ substrate. That is, the laser interferometric sizing device has become an essential technology to improve the uniformity of finished thickness in polishing such as DSP. The resistivity is commonly 10 Ω·cm or more in $P^-$ substrate, more than 0.01 Ω·cm and less than 10 Ω·cm in $P^+$ substrate, and 0.01 Ω·cm or less in $P^{++}$ substrate, particularly in this description.

In recent years, it becomes necessary to cope with high flatness also in the $P^{++}$ substrate with lower specific resistance, and the laser interferometric sizing device has been reexamined. Hereinafter, the mechanism of laser interferometric sizing device will be described with exemplifying a double-side polishing apparatus.

In a laser interferometric sizing device, laser beam for interference pierces a hole formed to penetrate the turn table of the double-side polishing apparatus. In polishing of a substrate, the substrate is rotated and revolved by rotation of a gear that is engaged with a carrier, and the foregoing hole is formed on a position where the orbits of rotation and revolving of the substrate pass. Accordingly, the laser interferometric sizing device allows laser beam to pierce through this hole to irradiate the substrate in course of polishing with the laser beam, and allows the reflected light from the front and back surfaces of the substrate to be introduced into a light-receiving portion almost simultaneously.

These signals are introduced as digital signals and are recognized as information of the thickness of the substrate by using a Fourier transformation. In this case, the signals of the reflected light from the back surface of substrate can be introduced sufficiently from $P^-$ and $P^+$ substrates, but the reflected light becomes weak in $P^{++}$ substrates.

FIG. 6 shows a relation between resistivity of wafer (thickness of 775 μm) and transmittance of laser beam. The laser beam used for conventional sizing device has a wavelength of about 1300 nm, and the transmittance at this wavelength is about 50% in $P^-$ substrate, but only about 1% in $P^{++}$ substrate.

Accordingly, measurement of the thickness of $P^{++}$ substrate can be achieved by increasing the output of laser beam to about twice as much as in measuring the thickness of $P^-$ substrate and by setting the optimal region of the frequency. As described above, highly accurate sizing has become possible with the laser interferometric sizing device by changing the wavelength and intensity of laser beam.

In this way, it becomes possible to obtain thickness data not only in $P^-$ substrates and $P^+$ substrates but also in $P^{++}$ substrates, which have lower resistivity, by optimizing output of laser beam and signals used for a Fourier transformation.

CITATION LIST

Patent Literature

Patent Document 1: Japanese Unexamined Patent Application Publication (Kokai) No. H11-285956

SUMMARY OF INVENTION

Technical Problem

In continuous polishing of a substrate, however, it becomes frequent to observe phenomena in which required accuracy of sizing cannot be maintained depending on a group (lot) of substrates to be polished. There has been a problem that accuracy of sizing cannot be secured in the first batch after changing a lot, particularly in polishing of a substrate with low resistivity, thereby often failing to obtain an intended thickness of the substrate.

Accordingly, after changing a polishing lot of substrates, the intended thickness has been adjusted by a method in which a difference from the intended thickness is calculated from the first finished thickness of the substrate polished at the first polishing batch in the lot, and the difference from the intended thickness is taken into account in processing of the next polishing batch to maintain the accuracy of polishing.

In this method, however, the test processing to determine a difference from the intended thickness after changing a lot causes lowering of the yield and increase of the production cost.

As described above, there have been problems that the required accuracy of sizing sometimes cannot be maintained depending on the lot of substrates polished in a continuous polishing, and the yield is lowered due to test processing performed in every alteration of the lot to decrease the difference from an intended thickness that is caused by lowering of accuracy of polishing.

The present invention was accomplished in view of the above-described problems. It is an object of the present invention to provide a sizing device that can prevent accuracy of polishing from lowering to give high accuracy in continuous polishing when a lot of substrates to be polished is changed.

The present invention also aims to provide a polishing method that can give a substrate with slight difference from the intended thickness without necessity of test processing of a substrate by preventing the accuracy of sizing from lowering due to alteration of a lot of substrates to be polished.

Solution to Problem

To solve the problems described above, the present invention provides a sizing device provided in a polishing apparatus for polishing a surface of a wafer for measuring a thickness of the wafer in course of polishing with the polishing apparatus in which the wafer brought into sliding contact with a polishing pad pasted on a turn table, and the thickness of the wafer is measured by laser beam interference, comprising:

a light-source for irradiating the wafer in course of polishing with a laser beam, a light-receiving portion for receiving reflected light from the wafer in course of polishing irradiated with the laser beam from the light-source, a calculating part for calculating a measured value of the thickness of the wafer in course of polishing irradiated with the laser beam based on the reflected light received through the light-receiving portion, wherein the calculating part is capable of calculating the thickness of the wafer in course of polishing by calculating a measuring error value of the thickness of the wafer in course of polishing from resistivity of the wafer in course of polishing based on a previously determined correlation between wafer resistivity and measuring error value of wafer thickness, with the measured value being corrected for the measuring error value.

In the inventive sizing device, a measuring error of wafer thickness in a sizing device can be calculated from resistivity of a wafer in course of polishing based on correlation between wafer resistivity and measuring error value of wafer thickness. Accordingly, the measuring error can be compensated depending on the resistivity when the lot of wafers to be polished is changed during continuous polishing to change resistivity of wafer to be polished, whereby the actual thickness of a wafer in polishing can be measured with high accuracy.

It is preferable that the calculating part be capable of correcting the thickness of the wafer in course of polishing for the measuring error by determining an offset value for cancelling the measuring error in the measured value from the resistivity of the wafer in course of polishing based on the correlation between wafer resistivity and a measuring error value of wafer thickness, with the offset value being added to or subtracted from the measured value.

As described above, the actual thickness of a wafer in polishing can be measured with high accuracy, more specifically, by compensating the measuring error with the offset value to cancel the measuring error of thickness of a wafer in polishing in the way described above.

The resistivity of the wafer in course of polishing can be a value determined from resistivity at the both ends of an ingot from which the wafer in course of polishing have been cut out and resistivity of a portion of the ingot from which the wafer in course of polishing have been cut out.

In this way, the resistivity of wafer in polishing can be easily determined in each substrate.

It is preferable that the correlation between wafer resistivity and a measuring error value of wafer thickness be based on each of the polishing apparatus.

The correlation between wafer resistivity and measuring error value of wafer thickness can slightly differ depending on polishing apparatus. Accordingly, the accuracy of sizing can be further improved by using the foregoing correlation in each polishing apparatus.

It is preferable that the resistivity of the wafer be 0.01 $\Omega \cdot cm$ or less.

The inventive sizing device can be favorably used for measuring a thickness of low-resistance wafer the resistivity of 0.01 $\Omega \cdot cm$ or less in particular.

To achieve the foregoing objects, the present invention also provides a polishing apparatus comprising any of the sizing device described above.

In such a polishing apparatus, a thickness of wafer in course of polishing can be calculated accurately, and a wafer can be obtained with slight difference from an intended thickness thereby. In addition, test polishing for calculating difference from an intended thickness is not necessarily required, and the yield can be improved thereby.

To achieve the foregoing objects, the present invention also provides a polishing method including a step of polishing a surface of a wafer by bringing the wafer into sliding contact with a polishing pad pasted on a turn table; wherein the wafer is polished while measuring a thickness of the wafer in course of polishing by using a sizing device by which the thickness of the wafer in course of polishing is measured by laser beam interference, and the polishing is stopped when the measured value of the thickness of the wafer in course of polishing measured by using the sizing device becomes a prescribed value, comprising:

a step of deriving a correlation between wafer resistivity and measuring error value of wafer thickness to previously determine the correlation before the step of polishing;

wherein the wafer is polished while calculating the thickness of the wafer in course of polishing in the step of polishing by calculating a measuring error value of the thickness of the wafer in course of polishing from resistivity of the wafer in course of polishing based on the correlation between wafer resistivity and measuring error value of wafer thickness, with the measured value of the thickness of the wafer in course of polishing being corrected for the measuring error value.

In the inventive polishing method, a measuring error of a sizing device in wafer thickness can be calculated from resistivity of the wafer in course of polishing, together with the correlation between wafer resistivity and a measuring error value of wafer thickness. Accordingly, when a lot of wafers to be polished is changed to change the resistivity of wafer to be polished in continuous polishing, the measuring error can be compensated depending on the resistivity, and a wafer with slight difference from an intended thickness can be obtained thereby. In addition, test polishing for calculating difference from an intended thickness is not necessarily required in each alteration of a lot of wafers, and the yield can be improved thereby.

In the inventive polishing method, it is preferable that the thickness of the wafer in course of polishing be corrected for the measuring error value by calculating an offset value for cancelling the measuring error value in the measured value of the thickness of the wafer in course of polishing measured by using the sizing device from the resistivity of the wafer to be polished based on the correlation between wafer resistivity and measuring error value of wafer thickness, with the offset value being added to or subtracted from the measured value of the thickness of the wafer in course of polishing.

In this way, the measuring error of wafer thickness in course of polishing can be compensated, more specifically, by cancelling the measuring error with the offset value.

It is preferable that the inventive polishing method further comprise a step of test polishing previous to the step of deriving a correlation, wherein a plurality of test wafers with different resistivity are previously subjected to test polishing while measuring thicknesses of the test wafers by using the sizing device, and the correlation between wafer resistivity and a measuring error value of wafer thickness is determined in the step of deriving a correlation on the basis of the thicknesses of the test wafers after the test polishing.

In this way, the correlation between wafer resistivity and a measuring error value of wafer thickness can be obtained as a concrete form of the present invention.

The resistivity of the wafer to be polished can be determined from resistivity at the both ends of an ingot from which the wafer to be polished have been cut out and resistivity of a portion of the ingot from which the wafer have been cut out.

In this way, the resistivity of wafer to be polished can be obtained easily in each substrate.

It is preferable that the correlation between wafer resistivity and measuring error value of wafer thickness be determined on the basis of each of the polishing apparatus.

The correlation between wafer resistivity and a measuring error value of wafer thickness sometimes differs in each polishing apparatus. Accordingly, the accuracy in sizing can be improved by using the foregoing correlation of each polishing apparatus.

It is preferable that the resistivity of the wafer to be polished be 0.01 Ω·cm or less.

The inventive polishing method can be favorably used for polishing a low-resistance wafer with the resistivity of 0.01 Ω·cm or less in particular, while measuring the thickness thereof.

Advantageous Effects of Invention

In the present invention, high accuracy of sizing can be obtained by preventing lowering of accuracy in sizing due to alteration of a lot of substrates to be polished, and a substrate with slight difference from an intended thickness can be obtained thereby. In addition, test polishing of a substrate is not necessarily required, and the yield can be improved thereby.

DESCRIPTION OF EMBODIMENTS

Hereinafter, the embodiments of the present invention will be described, but the present invention is not limited thereto.

As described above, there have been a problem that accuracy of sizing varies due to alteration of a lot of wafers to be polished, causing the polished wafer to have a thickness with larger difference from an intended thickness.

The present inventors have diligently investigated to solve the forgoing problem to found that resistivity of wafer has a correlation with a measuring error value of wafer thickness. The inventors have conceived to calculate a wafer thickness more accurately by correcting it with the measuring error on the basis of this correlation and resistivity of wafer to be polished, thereby completing the present invention.

Figure 1:
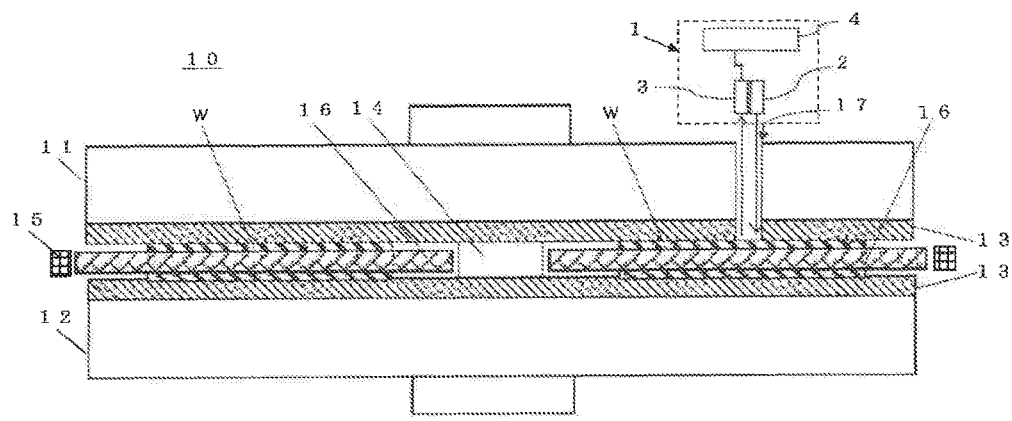
FIG. 1 is a schematic sectional view showing an example of a sizing device, together with polishing apparatus provided with the sizing device according to the present invention.

First, a sizing device and a polishing apparatus provided with the sizing device according to the present invention will be described by reference to FIG. 1. FIG. 1 shows an example of a double-side polishing apparatus provided with the inventive sizing device. As shown in FIG. 1, the inventive sizing device 1 can be installed in the double-side polishing apparatus 10.

As shown in FIG. 1, the double-side polishing apparatus 10 is provided with the upper turn table 11 and the lower turn table 12 that are provided upward and downward facing with each other, and each of the turn tables 11 and 12 is pasted with the polishing pad 13. Between the upper turn table 11 and the lower turn table 12, the sun gear 14 is provided at the central part, and the circular internal gear 15 is provided at the peripheral part. The wafers W are held in holding holes of the carrier 16 and are interposed between the upper turn table 11 and the lower turn table 12.

The sun gear 14 and the internal gear 15 each have a teeth portion engaged with corresponding teeth of the outer circumferential gear of the carrier 16, which enables the carrier 16 to revolve around the sun gear 14 while rotating, interlocking with the upper turn table 11 and the lower turn table 12 being rotated by an actuator, which is not shown in the figure. At this time, the wafer W, held in the holding hole of the carrier 16, is brought into sliding contact with the upper and lower polishing pads 13, and the both surfaces are polished simultaneously thereby. Incidentally, the wafer W is supplied with slurry from a nozzle, which is not shown in the figure, in polishing of the wafer W.

The inventive sizing device 1 applies laser beam interference to measure the thickness of wafer in course of polishing with the polishing apparatus as shown in FIG. 1. This sizing device 1 is provided with the light-source 2 for irradiating the wafer W with a laser beam in course of polishing by using such a double-side polishing apparatus 10 as described above, the light-receiving portion 3 for receiving reflected light from the wafer W in course of polishing, and the calculating part 4 for calculating a measured value of the thickness of the wafer W in course of polishing on the basis of the reflected light. As shown in FIG. 1, the incident light into the wafer W and the reflected light from the wafer W pierce the hole 17 provided in the upper turn table 11.

In the inventive sizing device 1, the calculating part 4 is capable of calculating the thickness of the wafer W in course of polishing by calculating a measuring error value of the thickness of the wafer in course of polishing from resistivity of the wafer W in course of polishing based on previously determined correlation between wafer resistivity and a measuring error value of wafer thickness, and by compensating the measuring error value.

More specifically, the calculating part 4 is capable of compensating the measuring error of the thickness of the wafer in course of polishing by determining an offset value for cancelling the measuring error in the measured value from the resistivity of the wafer in course of polishing based on the correlation between wafer resistivity and a measuring error value of wafer thickness, with the offset value being added to or subtracted from the measured value.

To perform this series of operations effectively, it is desirable to use a terminal such as a personal computer (PC) as the calculating part 4. By introducing a PC, it becomes possible to acquire data from a database, and to automatically perform a series of operations such as automatic acquisition of resistivity data of a wafer to be polished, calculation of the offset values, and addition or subtraction of the calculated offset values to measured values.

Subsequently, the inventive polishing method will be described by reference to the double-side polishing apparatus 10 provided with the inventive sizing device 1 shown in FIG. 1.

The inventive polishing method includes a step of deriving a correlation, in which the correlation between wafer resistivity and a measuring error value of wafer thickness is previously determined before the step of polishing the wafer W.

The correlation can be determined by the following, for example. First, a test polishing step is previously performed, in which a plurality of test wafers with different resistivity are each subjected to test polishing while measuring the thicknesses of the test wafers with the sizing device, before the step of deriving a correlation. In the test polishing, the polishing is stopped when the measured value of the thickness of the test wafer by using the sizing device becomes an intended value.

Then, the intended thickness set in the test polishing and the actual thickness of the polished test wafer are recorded. The difference of these values are used for calculating a measuring error value of the measured value of thickness of test wafer in the test polishing. In the test polishing, the inventive sizing device 1 may be used as the sizing device. At this stage, however, the measuring error is not compensated in the measured value of thickness of test wafer since the foregoing correlation is not determined yet.

Subsequently, the step of deriving a correlation is performed. In this step, the correlation between wafer resistivity and a measuring error value of wafer thickness can be determined from the data of measuring error of wafer thickness occurred in the test polishing and resistivity of the wafer.

Figure 2:
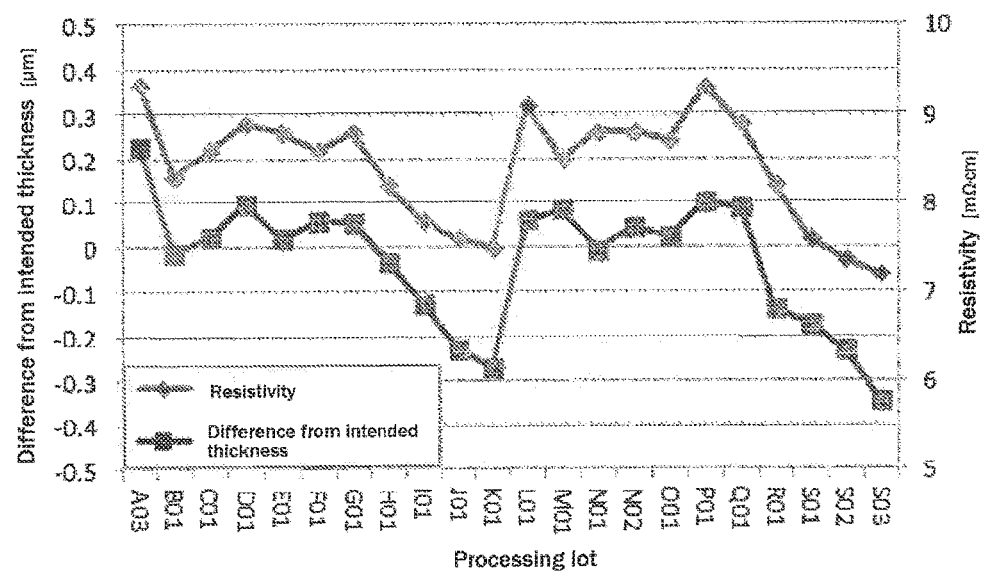
FIG. 2 is a chart showing a relation between resistivity of test wafer and a measuring error value in a measured value of thickness of test wafer determined in Example.
Figure 3:
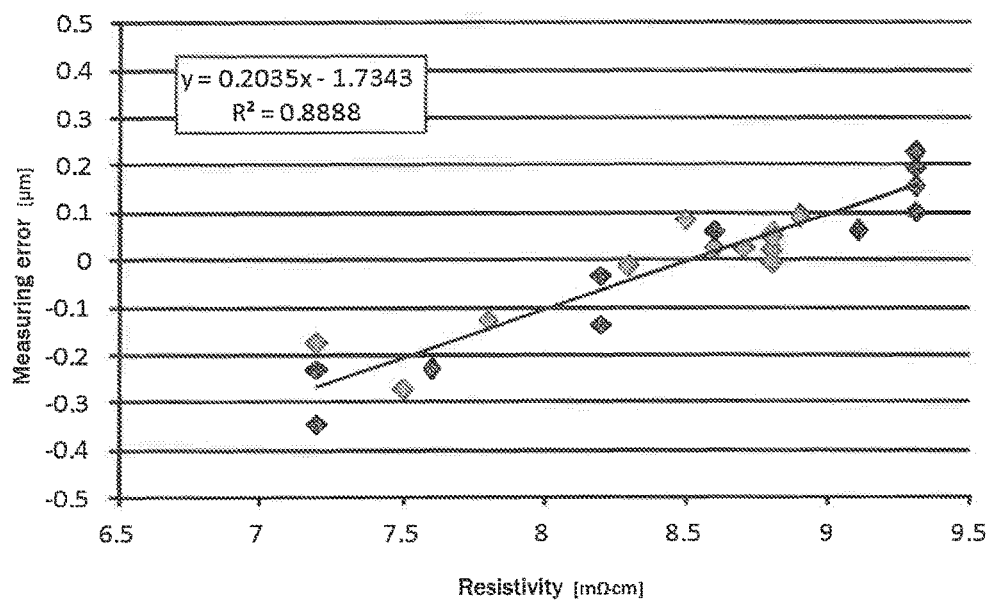
FIG. 3 is a chart showing relation between resistivity of wafer and a measuring error value in a measured value of wafer thickness determined in Example.

For example, each [measuring error] is determined by calculating ([an actual thickness of test wafer]−[an intended thickness]) on the basis of polishing data of wafers with various resistivity recorded in the step of test polishing and is plotted in relation to [resistivity of test wafer] to give a relation of measuring error in terms of resistivity through the least squares method. As the examples, FIGS. 2 and 3 show correlations between resistivity and a measuring error value determined in Example that will be described later. It can be seen from FIG. 3, in particular, that the [measuring error] and the [resistivity of test wafer] give a regression line with high correlation. In this way, it is possible to derive the correlation between wafer resistivity and a measuring error value of wafer thickness.

It is preferable to determine the correlation between wafer resistivity and measuring error value of wafer thickness on the basis of each of the polishing apparatus. In the relation of wafer resistivity and measuring error value of wafer thickness, the slope and the intercept can vary in each polishing apparatus provided with a sizing device. Accordingly, the correlation is preferably determined in each polishing apparatus to calculate the measuring error highly accurately. Since the correlation may be influenced by the polishing conditions, constant renewal of the relation can further improve the accuracy of sizing.

Then, the step of polishing wafer W is performed. In the polishing step, the polishing is performed while measuring the thickness of the wafer in course of polishing by using a sizing device by which the thickness of the wafer in course of polishing is measured by laser beam interference. The polishing is stopped when the measured value of the thickness of the wafer in course of polishing measured by using the sizing device becomes a prescribed value.

In the polishing step of the present invention, measuring error value of the thickness of the wafer in course of polishing is calculated from resistivity of the wafer in course of polishing based on the correlation between wafer resistivity and measuring error value of wafer thickness determined in the step of deriving a correlation. The wafer is polished while calculating the thickness of the wafer in course of polishing by compensating the measuring error value.

More specifically, the measuring error can be compensated as follows. First, an offset value is calculated for cancelling the measuring error value in the measured value of the thickness of the wafer, which is measured by using the sizing device in course of polishing, from the resistivity of the wafer to be polished based on the correlation between wafer resistivity and measuring error value of wafer thickness as shown in FIG. 3.

The resistivity of the wafer to be polished can be determined from resistivity at the both ends of an ingot from which the wafer to be polished have been cut out and resistivity of a portion of the ingot from which the wafer have been cut out, for example. The resistivity of an ingot is always measured before cutting out (slicing) a wafer, and the resistivity at the both ends of the ingot can be easily obtained thereby. In an ingot produced by CZ pulling method, segregation phenomenon occurs during the pulling, thereby making it possible to easily determine the resistivity at each portion by using the distance from the end of the ingot. Accordingly, the resistivity of a wafer to be polished can be easily determined in each of substrates which are defined in the order of slicing.

Then, the measuring error is cancelled using the calculating part 4, by which the offset value is added to or subtracted from the measured value of the thickness of the wafer in course of polishing. This enables the actual thickness of wafer to be calculated with high accuracy.

As described above, in the present invention, a measuring error value occurred in the main polishing can be calculated from the resistivity of a wafer to be polished based on the correlation between wafer resistivity and measuring error value of wafer thickness, and the actual thickness of the wafer in course of polishing can be calculated with high accuracy by measuring the thickness of the wafer in course of polishing while compensating the measuring error. Accordingly, test processing is not necessarily required, and polishing can be performed with slight difference between an intended thickness and a finished thickness. The present invention also makes it possible to decrease the difference of a finished thickness from an intended thickness to about ±0.1 µm or less, or further smaller value, even in polishing of a low resistance wafer with the resistivity of 0.01 Ω·cm or less such as a $P^{++}$ substrate in particular.

EXAMPLE

Hereinafter, the present invention will be described more specifically by showing Example of the present invention and Comparative Example, but the present invention is not limited to this Example.

Example

A plurality of silicon wafers with the diameter of 300 mm were continuously polished by the inventive polishing method using the double-side polishing apparatus 10 provided with the sizing device 1 as shown in FIG. 1. The polishing agent was colloidal silica with the average particle size of 35 to 70 nm, containing potassium hydroxide added thereto, diluted with pure water to have a pH of 10.5. As the polishing pads, commercially available non-woven fabric type was used.

First, a plurality of P$^{++}$ test silicon wafers with various resistivity (the resistivity of 7.2 to 9.3 mΩ·cm) were subjected to continuous test polishing by using the double-side polishing apparatus 10 shown in FIG. 1. As the calculating part 4, a PC was used. This PC was connected to the double-side polishing apparatus 10 to manage the input record of actual finished thicknesses of wafers, intended thicknesses, offset values, and resistivity. The laser beam used in the sizing device was infrared wavelength-tunable laser with a wavelength of 1300 nm and an output of 10 mW or more.

The relation between change of resistivity of test wafer and measuring error (the difference of a finished thickness from an intended thickness) in the test polishing is shown in FIG. 2. As can be seen from FIG. 2, high correlation is found between the resistivity of wafer and the measuring error.

Subsequently, the step of deriving a correlation was performed. In this step, each [measuring error] is determined by calculating ([an actual thickness of test wafer]–[an intended thickness]) on the basis of polishing data recorded in the step of test polishing and is plotted in relation to [resistivity of test wafer] to give correlation of measuring error of wafer thickness in terms of resistivity of the wafer through the least squares method. The obtained correlation between [measuring error] and [resistivity of test wafer] is shown in FIG. 3. As can be seen from FIG. 3, a regression line with high correlation was obtained.

Then, the step of polishing was performed. In this step, wafers with different resistivity for each lot (the resistivity of 5 to 10 mΩ·cm) were polished. The offset value was calculated as follows. When the lot was changed to introduce a substrate having different resistivity by 1 mΩ·cm in this double-side polishing apparatus, it was found that the measuring error value differed by about 0.2035 μm depending on the change of resistivity based on the relation shown in FIG. 3, that is [measuring error (μm)]=0.2035×[resistivity (mΩ·cm)]–1.7343. The following considers a case in which a silicon wafer with resistivity of 8.5 mΩ·cm is polished (in this case, the [offset value]=0 on the basis of the relation shown in FIG. 3), and then a silicon wafer of the next lot having resistivity of 9.5 mΩ·cm after compensating the measuring error, for example. In the polishing of the silicon wafer with resistivity of 9.5 mΩ·cm, the offset value is increased by 0.2035 μm from that of the preceding lot in which a wafer with resistivity of 8.5 mΩ·cm is polished. That is, it is assumed that the [offset value]=0.2035 μm. In polishing the silicon wafer with resistivity of 9.5 mΩ·cm, the measuring error can be cancelled by subtracting the offset value of 0.2035 μm from the measured value, and the wafer with different resistivity can be provided with the same finished thickness. When a silicon wafer with resistivity of 9.5 mΩ·cm is polished, and then a silicon wafer with resistivity of 7.5 mΩ·cm in the next lot is polished, for example, the offset value is decreased by 0.4070 μm from that of the preceding lot in which a wafer with resistivity of 9.5 mΩ·cm is polished. That is, it is assumed that the [offset value]=–0.2035 μm. In polishing the silicon wafer with resistivity of 7.5 mΩ·cm, the measuring error can be compensated by subtracting the offset value of –0.2035 μm from (adding 0.2035 μm to) the measured value, and the same finished thickness can be obtained as in the foregoing.

The resistivity of wafer to be polished had been measured before cutting out the substrate and was recorded in a data base of the PC (the calculating part 4), together with the lot information. The calculating part 4 had been provided with a program to call data of lot information and resistivity before polishing to calculate an offset value automatically from the difference between resistivity of wafer to be polished and resistivity of wafer in the preceding lot. In Example, polishing was performed while altering the offset value based on the resistivity of wafer to be polished when changing the lot by using such a program. When such a program is installed in the calculating part 4, it is possible to sufficiently cope with an alteration of an intended thickness.

Figure 4:
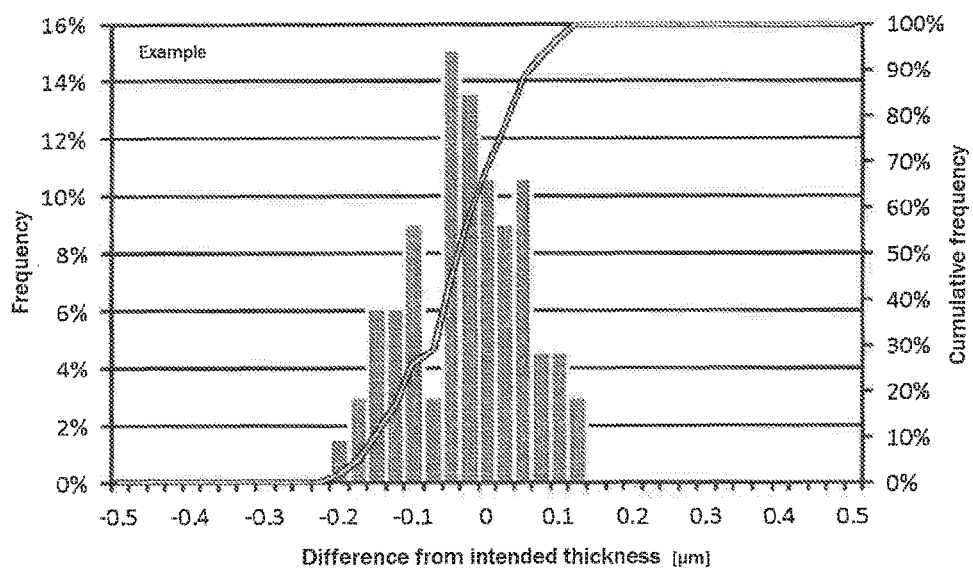
FIG. 4 is a chart showing results of polishing wafers in Example.

FIG. 4 shows a distribution of difference between intended thickness and finished thickness of wafer that was continuously polished as described above. As shown in FIG. 4, the differences from intended values were controlled smaller compared to those of Comparative Example that will be described later. It was found that larger proportion of wafers showed the difference from an intended value that was within ±0.1 μm, in particular, compared to that of Comparative Example which will be described below. This is because highly accurate sizing could be performed by appropriately compensating the measuring error of thickness depending on alteration of resistivity of wafer when chancing the lot.

Comparative Example

Polishing of silicon wafers with the diameter of 300 mm was performed in the same condition as in Example except that the sizing device was a conventional sizing device to perform polishing without compensating a measuring error.

Figure 5:
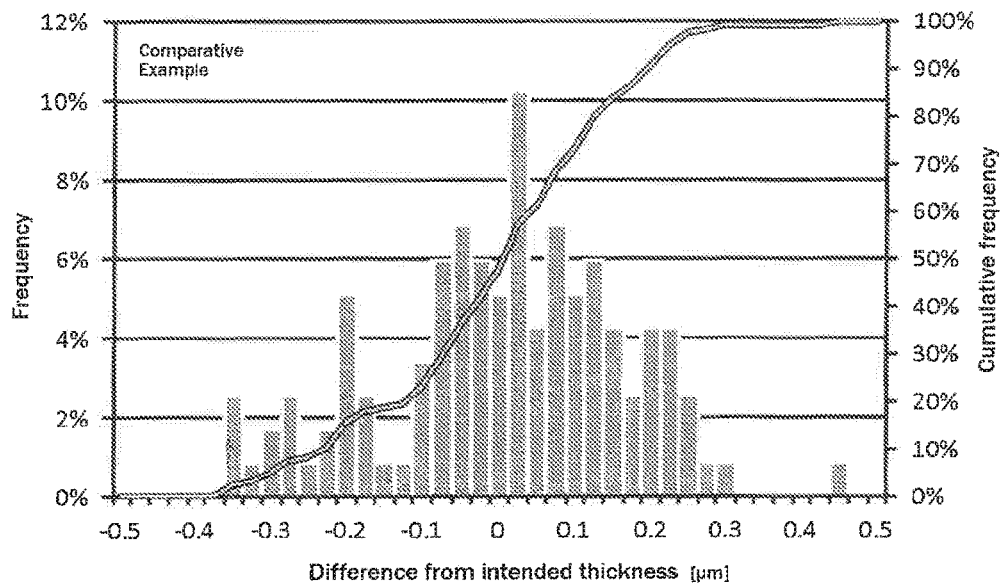
FIG. 5 is a chart showing results of polishing wafers in Comparative Example.
Figure 6:
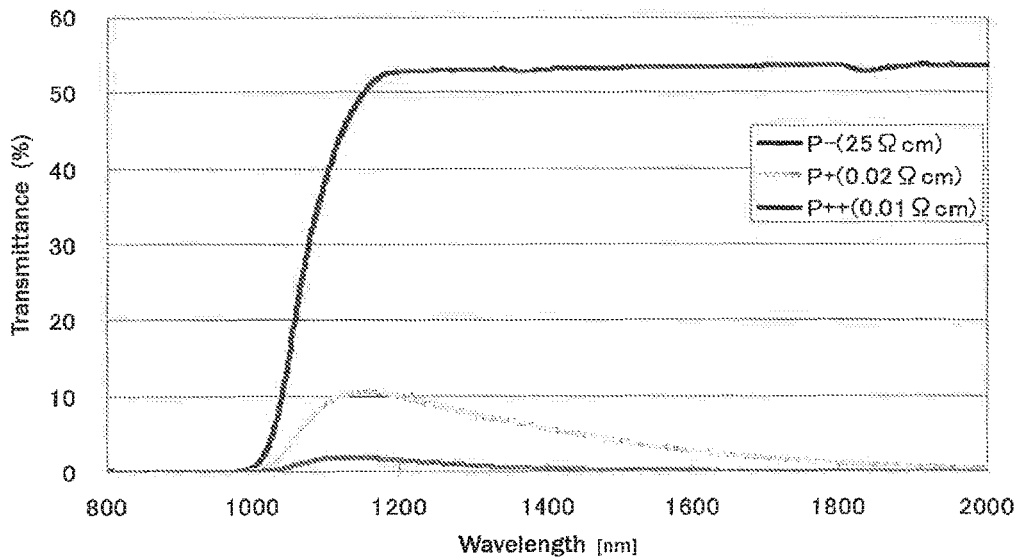
FIG. 6 is a chart showing relation between resistivity and transmittance of laser beam in substrates.

FIG. 5 shows a distribution of difference between intended thickness and finished thickness of wafer that was polished as described above. As shown in FIG. 5, the variation of finished thickness became larger, and the differences from the intended thickness became larger. The ratio of wafers that showed the difference from an intended value of ±0.1 μm or more, in particular, was largely increased compared to that of Example.

It is to be noted that the present invention is not limited to the foregoing embodiment. The embodiment is just an exemplification, and any examples that have substantially the same feature and demonstrate the same functions and effects as those in the technical concept described in claims of the present invention are included is the technical scope of the present invention.

The invention claimed is:

1. A sizing device provided in a polishing apparatus for polishing a surface of a wafer for measuring a thickness of the wafer in course of polishing with the polishing apparatus in which the wafer is brought into sliding contact with a polishing pad pasted on a turn table, and the thickness of the wafer is measured by laser beam interference, comprising: a light-source for irradiating the wafer in course of polishing with a laser beam, a light-receiving portion for receiving reflected light from the wafer in course of polishing irradiated with the laser beam from the light-source, a calculating part for calculating a measured value of the thickness of the wafer in course of polishing irradiated with the laser beam based on the reflected light received through the light-receiving portion, wherein the calculating part is configured to calculate the thickness of the wafer in course of polishing by calculating a measuring error value of the thickness of the wafer in course of polishing from resistivity of the wafer in course of polishing based on a previously determined correlation between wafer resistivity and measuring error value of wafer thickness, with the measured value being corrected for the measuring error value.

2. The sizing device according to claim 1, wherein the calculating part is configured to correct the thickness of the wafer in course of polishing for the measuring error value by determining an offset value for cancelling the measuring error value in the measured value from the resistivity of the wafer in course of polishing based on the correlation between wafer resistivity and measuring error value of wafer thickness, with the offset value being added to or subtracted from the measured value.

3. The sizing device according to claim 1, wherein the resistivity of the wafer in course of polishing is a value determined from resistivity at the both ends of an ingot from which the wafer in course of polishing have been cut out and resistivity of a portion of the ingot from which the wafer in course of polishing have been cut out.

4. The sizing device according to claim 2, wherein the resistivity of the wafer in course of polishing is a value determined from resistivity at the both ends of an ingot from which the wafer in course of polishing have been cut out and resistivity of a portion of the ingot from which the wafer in course of polishing have been cut out.

5. The sizing device according to claim 1, wherein the correlation between wafer resistivity and measuring error value of wafer thickness is based on each of the polishing apparatus.

6. The sizing device according to claim 2, wherein the correlation between wafer resistivity and measuring error value of wafer thickness is based on each of the polishing apparatus.

7. The sizing device according to claim 3, wherein the correlation between wafer resistivity and measuring error value of wafer thickness is based on each of the polishing apparatus.

8. The sizing device according to claim 4, wherein the correlation between wafer resistivity and measuring error value of wafer thickness is based on each of the polishing apparatus.

9. The sizing device according to claim 1, wherein the resistivity of the wafer is 0.01 Ω·cm or less.

10. A polishing apparatus comprising the sizing device according to claim 1.

11. A polishing method including a step of polishing a surface of a wafer by bringing the wafer into sliding contact with a polishing pad pasted on a turn table; wherein the wafer is polished while measuring a thickness of the wafer in course of polishing by using a sizing device by which the thickness of the wafer in course of polishing is measured by laser beam interference, and the polishing is stopped when the measured value of the thickness of the wafer in course of polishing measured by using the sizing device becomes a prescribed value, comprising:

a step of deriving a correlation between wafer resistivity and measuring error value of wafer thickness to previously determine the correlation before the step of polishing;
wherein the wafer is polished while calculating the thickness of the wafer in course of polishing in the step of polishing by calculating a measuring error value of the thickness of the wafer in course of polishing from resistivity of the wafer in course of polishing based on the correlation between wafer resistivity and measuring error value of wafer thickness, with the measured value of the thickness of the wafer in course of polishing being corrected for the measuring error value.

12. The polishing method according to claim 11, wherein the thickness of the wafer in course of polishing is corrected for the measuring error value by calculating an offset value for cancelling the measuring error value in the measured value of the thickness of the wafer in course of polishing measured by using the sizing device from the resistivity of the wafer to be polished based on the correlation between wafer resistivity and measuring error value of wafer thickness, with the offset value being added to or subtracted from the measured value of the thickness of the wafer in course of polishing.

13. The polishing method according to claim 11, further comprising a step of test polishing previous to the step of deriving a correlation, wherein a plurality of test wafers with different resistivity are previously subjected to test polishing while measuring thicknesses of the test wafers by using the sizing device, and the correlation between wafer resistivity and measuring error value of wafer thickness is determined in the step of deriving a correlation on the basis of the thicknesses of the test wafers after the test polishing.

14. The polishing method according to claim 12, further comprising a step of test polishing previous to the step of deriving a correlation, wherein a plurality of test wafers with different resistivity are previously subjected to test polishing while measuring thicknesses of the test wafers by using the sizing device, and the correlation between wafer resistivity and measuring error value of wafer thickness is determined in the step of deriving a correlation on the basis of the thicknesses of the test wafers after the test polishing.

15. The polishing method according to claim 11, wherein the resistivity of the wafer to be polished is determined from resistivity at the both ends of an ingot from which the wafer to be polished have been cut out and resistivity of a portion of the ingot from which the wafer have been cut out.

16. The polishing method according to claim 12, wherein the resistivity of the wafer to be polished is determined from resistivity at the both ends of an ingot from which the wafer to be polished have been cut out and resistivity of a portion of the ingot from which the wafer have been cut out.

17. The polishing method according to claim 13, wherein the resistivity of the wafer to be polished is determined from resistivity at the both ends of an ingot from which the wafer to be polished have been cut out and resistivity of a portion of the ingot from which the wafer have been cut out.

18. The polishing method according to claim 14, wherein the resistivity of the wafer to be polished is determined from resistivity at the both ends of an ingot from which the wafer to be polished have been cut out and resistivity of a portion of the ingot from which the wafer have been cut out.

19. The polishing method according to claim 11, wherein the correlation between wafer resistivity and measuring error value of wafer thickness is determined on the basis of each of the polishing apparatus.

20. The polishing method according to claim 11, wherein the resistivity of the wafer to be polished is 0.01 Ω·cm or less.

* * * * *